(12) United States Patent
Martin

(10) Patent No.: US 7,511,587 B2
(45) Date of Patent: Mar. 31, 2009

(54) OSCILLATOR COMPRISING TWO ONE-PORT SURFACE WAVE RESONATORS

(75) Inventor: Günter Martin, Dresden (DE)

(73) Assignee: Tele Filter GmbH, Teltow (DE)

( * ) Notice: Subject to any disclaimer, the term of this patent is extended or adjusted under 35 U.S.C. 154(b) by 112 days.

(21) Appl. No.: 11/793,002

(22) PCT Filed: Dec. 13, 2005

(86) PCT No.: PCT/EP2005/056710

§ 371 (c)(1),
(2), (4) Date: Jun. 13, 2007

(87) PCT Pub. No.: WO2006/063984

PCT Pub. Date: Jun. 22, 2006

(65) Prior Publication Data

US 2008/0106346 A1    May 8, 2008

(30) Foreign Application Priority Data

Dec. 14, 2004  (DE)  ........................ 10 2004 060 901

(51) Int. Cl.
*H03B 5/32* (2006.01)
*H03B 9/12* (2006.01)
*H03H 9/02* (2006.01)

(52) U.S. Cl. .................... 331/107 A; 331/176; 333/193; 333/195

(58) Field of Classification Search ............. 331/107 A, 331/176; 333/193, 195; 310/313 A, 360
See application file for complete search history.

(56) References Cited

U.S. PATENT DOCUMENTS 4,193,045 A    3/1980   Houkawa et al.

(Continued)

FOREIGN PATENT DOCUMENTS

DE        29 38 158        4/1980

(Continued)

OTHER PUBLICATIONS

International Search Report.

(Continued)

*Primary Examiner*—Anh Q Tran
(74) *Attorney, Agent, or Firm*—Collard & Roe, P.C.

(57) ABSTRACT

The invention relates to an oscillator containing two one-port surface wave resonators as frequency-determining elements. The aim of the invention is to modify known oscillators such that the variable /S21/ for the oscillator frequency, that is adapted according to the respective temperature, only slightly depends on the temperature. The inventive oscillator is characterized in that, in relation to a pre-determined temperature, the first-order temperature coefficients of the synchronous frequency of the two one-port surface wave resonators (2; 3; 12; 13; 42; 43) have different signs or are equal to zero, and the second-order temperature coefficients of the synchronous frequency of the two one-port surface wave resonators have the same signs. The circuit consisting of the two one-port surface wave resonators is either two-terminal or four-terminal. The relationship between the openings in the converters and the relationship between the number of teeth are selected in such a way that, in the operating temperature range of the oscillator, the influence of the temperature on the oscillator frequency is kept to a minimum.

19 Claims, 3 Drawing Sheets

U.S. PATENT DOCUMENTS

| | | | |
|---|---|---|---|
| 4,272,742 | A | 6/1981 | Lewis et al. |
| 5,912,602 | A | 6/1999 | Takagi et al. |
| 7,042,133 | B2 * | 5/2006 | Kanna .................. 310/313 A |

FOREIGN PATENT DOCUMENTS

| | | |
|---|---|---|
| DE | 103 39 865 A1 | 3/2005 |
| DE | 10 2004 028 421 | 1/2006 |
| EP | 0 878 902 A | 11/1998 |
| EP | 1 406 385 A | 4/2004 |
| JP | 58 039105 A | 3/1983 |

OTHER PUBLICATIONS

J. Webster (ED), "Surface Acoustic Wave Devices," Wiley Encyclopedia of Electrical and Electronics Engineering, John Wiley & Sons, Inc., 1999, p. 127, XP 002369395. (ISR).

W. Buff et al., "A differential measurement SAW device for passive remote sensing," Proc. 1996, IEEE Ultrasonics Symposium, pp. 343-346. (Spec, p. 4).

Meinke, Gundlach, "Taschenbuch der Hochfrequenztechnik," (Pocket book of high-frequency technology), Springerverlag 1992, p. G 42, Section on Two-pole oscillators. (Spec, p. 7).

U. Tietze, Ch. Schenk, "Halbleiter-Schaltungstechnik," (Semiconductor circuit technology), Springerverlag, pp. 380-383. (Spec, p. 7).

J. Webster (ED), "Surface Acoustic Wave Devices," Wiley Encyclopedia of Electrical and Electronics Engineering, John Wiley & Sons, Inc., 1999, pp. 127-139, XP 002369395. (ISR).

W. Buff et al., "A differential measurement SAW device for passive remote sensing," Proc. 1996, IEEE Ultrasonics Symposium, pp. 343-346. (Spec, p. 4).

Meinke, Gundlach, "Taschenbuch der Hochfrequenztechnik," (Pocket book of high-frequency technology), Springerverlag 1992, pp. G42-G43, Section on Two-pole oscillators. (Spec, p. 7).

U. Tietze, Ch. Schenk, "Halbleiter-Schaltungstechnik," (Semiconductor circuit technology), Springerverlag, pp. 380-383. (Spec, p. 7).

* cited by examiner

OSCILLATOR COMPRISING TWO ONE-PORT SURFACE WAVE RESONATORS

CROSS REFERENCE TO RELATED APPLICATIONS

Applicant claims priority under 35 U.S.C. §119 of German Application No. 10 2004 060 901.2 filed Dec. 14, 2004. Applicant also claims priority under 35 U.S.C. §365 of PCT/EP 2005/056710 filed Dec. 13, 2005. The international application under PCT article 21(2) was not published in English.

1. Technical Field

The invention relates to the field of electrical engineering/electronics and relates to an oscillator that contains two one-port surface wave resonators as frequency-determining elements and an active electronic component. This oscillator can be used in various technical fields as a vibration generator or also as a sensor. The particular advantage of this oscillator consists in the fact that it has a very low temperature dependence of the oscillator frequency.

2. State of the Art

Oscillators are known that consist of an oscillator circuit that contains a circuit consisting of a one-port surface wave resonator as the frequency-determining element and an active electronic component, whereby each one-port surface wave resonator contains an interdigital converter for acoustical surface waves, and whereby the one-port surface wave resonators differ from one another by the temperature dependence of the synchronous frequency.

In the case of a special embodiment, the frequency-determining element of the oscillator circuit represents a parallel circuit of two one-port surface wave resonators, the substrates of which belong to one and the same crystal section, but use different propagation directions (DE 29 38 158[1]). The ST section of quartz serves as the crystal section. The substrate of the main resonator has the X-axis of quartz as the propagation direction, while the propagation direction of the auxiliary resonator is inclined at 41° relative to this. Accordingly, the temperature coefficient of the synchronous frequency of the first order disappears in the case of the main resonator. In contrast, the temperature coefficient of the synchronous frequency of the first order of the auxiliary resonator is not equal to zero. Despite the different orders of the temperature coefficients, it is possible to compensate the temperature coefficient of the synchronous frequency of the second order of the main resonator, in that the phase of the auxiliary resonator is set in such a manner that the signal of the auxiliary resonator is orthogonal to the total signal.

It has already been proposed to combine two two-port surface wave oscillators as the frequency-determining element of an oscillator, in such a manner that the converters form two pairs switched in parallel, whereby one converter of the first two-port resonator, in each instance, and one converter of the second two-port resonator, in each instance, form such a pair (DE 103 39 865.1). In this connection, the temperature coefficient of the synchronous frequency of the second order dominates in the two two-port surface wave resonators.

Furthermore, it has also already been proposed to use a cascade circuit of two two-port surface wave resonators as the frequency-determining element of an oscillator, whereby each two-port surface wave resonator contains a coupling object, for example a coupling converter, and the coupling objects of the two two-port surface wave resonators have electrical contact with one another by way of two connections (DE 10 2004 028 421.0). An inductance is switched between these two connections. The temperature coefficient of the synchronous frequency of the first order dominates in the two two-port surface wave resonators. The temperature coefficients of the synchronous frequency of the first order of the two-port surface wave resonators have opposite signs.

In connection with remote-queried sensors, it is known to combine two one-port surface wave resonators, the substrates of which represent different propagation directions of one and the same crystal section, for temperature compensation (A differential measurement SAW device for passive remote sensoring, W. Buff, M. Rusko, T. Vandahl, M. Goroll and F. Möller, Proc. 1996 IEEE Ultrasonics Symposium, p. 343-346 [2]). In this connection, it is a prerequisite for temperature compensation that these propagation directions have different phase velocities and almost the same temperature coefficients of the synchronous frequency.

The solution described in the reference [1] has the disadvantage that the variable $|S_{21}|$, at which the oscillator frequency that adjusts itself in the oscillator circuit as a function of temperature during operation of the known resonator as a four-pole, is too greatly dependent on the temperature, so that the amplifier causes undesirable non-linear effects in the feedback, as the result of an overly large amplification range, or overly high costs as a regulated amplifier, and jitter and phase noise change too greatly with the temperature.

DISCLOSURE OF THE INVENTION

The invention is based on the task of modifying oscillators of the known type, which contain acoustical surface wave resonators as frequency-determining elements, in such a manner that the variable $|S_{21}|$ at the oscillator frequency that adjusts itself at the temperature, in each instance, is only slightly dependent on the temperature.

This task is accomplished in that
a) the temperature coefficients of the first order of the synchronous frequency of the two one-port surface wave resonators, with reference to a predetermined temperature, have different signs or are equal to zero, and that the temperature coefficients of the second order of the synchronous frequency of the two one-port surface wave resonators, with reference to a predetermined temperature, have the same signs, whereby
   aa) if the temperature coefficients of the first order of the synchronous frequency of the two one-port surface wave resonators have different signs, the circuit consisting of the two one-port surface wave resonators is a two-pole, in which an inductance is switched in parallel at least to one of the one-port surface wave resonators, and whereby
   ab) if the temperature coefficients of the first order of the synchronous frequency of the two one-port surface wave resonators are equal to zero, the circuit consisting of the two one-port surface wave resonators is a four-pole, and that
b) in the case of the converters, the ratio of their apertures relative to one another and the ratio of their tooth numbers relative to one another are selected in such a manner that the temperature influence on the oscillator frequency is a minimum in the usage temperature range of the oscillator, or has a desired value deviating from the minimum.

In the following, practical embodiments of the invention will be described.

According to a practical embodiment of the invention, the circuit consisting of two one-port surface wave resonators can also be a two-pole, in which two circuits, in each of which a one-port surface wave resonator and an inductance are switched in parallel, in each instance, are switched in series.

This has the advantage that in addition to the temperature coefficient of the synchronous frequency of the first order, that of the second order can also be compensated. Such a two-pole can be connected with a component that has a region of differentially negative resistance or can be switched into the feedback of an amplifier, parallel to the input and output of this amplifier.

Components having a region of differentially negative resistance are, for example, Gunn elements, IMPATT diodes, and tunnel diodes (Meinke, Gundlach, Taschenbuch der Hochfrequenztechnik/Pocket book of high-frequency technology/, Springerverlag 1992, p. G 42, Section on Two-pole oscillators). However, voltage sources having a negative internal resistance can also be used (U. Tietze, Ch. Schenk, Halbleiter-Schaltungstechnik/Semiconductor circuit technology/, Springerverlag, p. 380-383).

The circuit consisting of two one-port surface wave resonators can also be a four-pole of the conductor type, whereby the two one-port surface wave resonators are switched in series by way of an electrical connection, and the first pole of the input of the four-pole is formed by a branching of the electrical connection, and the first pole of the output of the four-pole is formed by that connector of the first one-port surface wave resonator that is not connected with the second one-port surface wave resonator, in each instance, and the second pole of the input and the output of the four-pole is formed by that connector of the second one-port surface wave resonator that is not connected with the first one-port surface wave resonator, in each instance. The four-pole can be inserted into the feedback of an amplifier, and the input or output, respectively, of the four-pole can be connected with the output or input, respectively, of the amplifier, or vice versa.

The two one-port surface wave resonators can be built up with substrates of the same type of crystal or different types of crystals. The substrates can represent the same crystal section, but also different crystal sections. The one-port surface wave resonators can be built up on separate substrates, but also on one and the same substrate.

In the two one-port surface wave resonators, the temperature coefficient of the synchronous frequency of the same order can dominate. It is practical if this is the temperature coefficient of the first or second order. The temperature coefficient of the first order of the synchronous frequency of each of the two one-port surface wave resonators can be unequal to zero and differ in sign from this temperature coefficient of the other one-port surface wave resonator, in each instance. This can apply analogously for the temperature coefficients of the second order of the synchronous frequency of each of the two one-port surface wave resonators. However, it can also be practical if the temperature coefficients of the second order of the synchronous frequency of the two one-port surface wave resonators are unequal to zero and have the same sign, whereby the temperature coefficients of the first order, with reference to a predetermined temperature, are equal to zero.

If the temperature coefficients of the first order of the synchronous frequency of the two one-port surface wave resonators are supposed to differ in sign, it is practical that the crystal section is an ST section of quartz and that the direction perpendicular to the teeth of the converters and to the reflector strips is inclined at an angle between 0° and 45° for the one one-port surface wave resonator, and at an angle >45° to the crystallographic X-axis of quartz for the other one-port surface wave resonator.

Finally, the tooth periods, the metallization ratio, and the aperture of the converters, as well as the thickness of the electrode layer of the one-port surface wave resonators, can be selected in such a manner that their resonances have a predetermined frequency interval at a predetermined temperature, which serves to set an optimal temperature tolerance of the oscillator frequency.

In the following, the invention will be explained in greater detail using exemplary embodiments and the related drawings. The exemplary embodiments represent frequency-determining elements of oscillators.

EMBODIMENTS OF THE INVENTION

EXAMPLE 1

Figure 1:
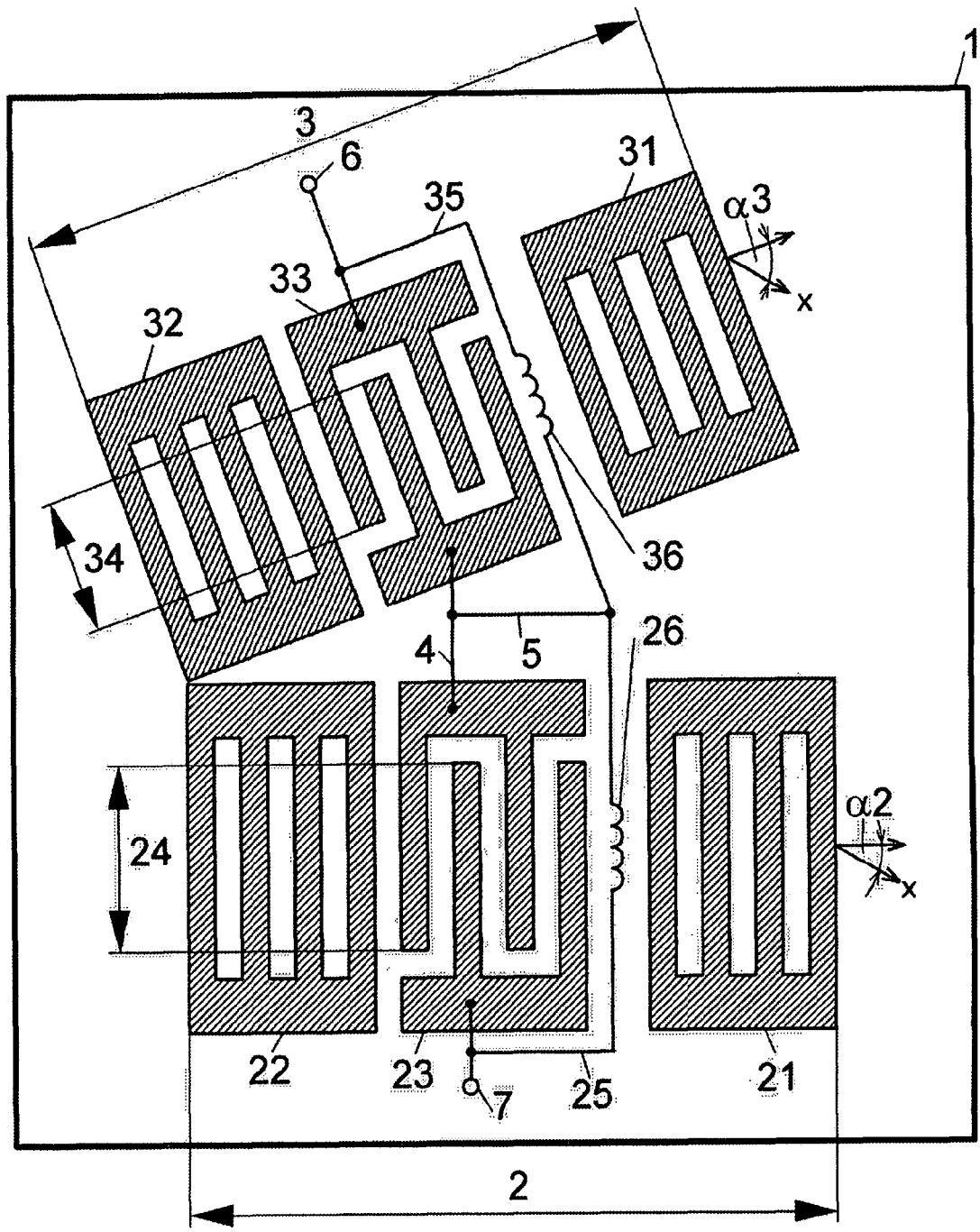
FIG. 1 shows, as a first exemplary embodiment, a serial circuit of two circuits, in each of which a one-port surface wave resonator and an inductance are switched in parallel.

In this connection, according to FIG. 1, two one-port surface wave resonators 2; 3 are disposed on a substrate 1 that is an ST section of quartz; the resonators are composed of the reflectors 21; 22 and the interdigital converter 23, and of the reflectors 31; 32 and the interdigital converter 33, respectively. The apertures 24; 34 of the converters 23; 33 are different from one another. The direction perpendicular to the teeth of the converter 23 and the strips of the reflectors 21; 22 is inclined at the angle $\alpha 2$ relative to the crystallographic X-axis, whereby $\alpha 2$ lies between 0° and 45°. The direction perpendicular to the teeth of the converter 33 and the strips of the reflectors 31; 32 is inclined at the angle $\alpha 3$ relative to the crystallographic X-axis, whereby $\alpha 3$ is greater than 45°. The directions designated with the angles $\alpha 2$ and $\alpha 3$ have a temperature coefficient of the synchronous frequency of the $n_{th}$ equal to the $1^{st}$ order, which is greater than and less than zero, respectively, while the temperature coefficients of the synchronous frequency of the $(n+1)^{th}$ equal to the $2^{nd}$ order of both directions have the same sign. The inductance 26 or 36, respectively, is switched in parallel to the converter 23 or 33, respectively, by way of the branch formed by the connections 25 and 5 or 35 and 5, respectively. These parallel circuits are switched in series by way of the connection 4. The resonator formed by the one-port surface wave resonators 2; 3 and the inductances 26; 36 is a two-pole whose connectors 6; 7 represent its two poles. It is possible to compensate both the temperature coefficient of the oscillator frequency of the first and of the second order by setting the ratio of the apertures 24 and 34 and the tooth number of the converters 23; 33 as well as of the inductances 26; 36.

EXAMPLE 2

Figure 2:
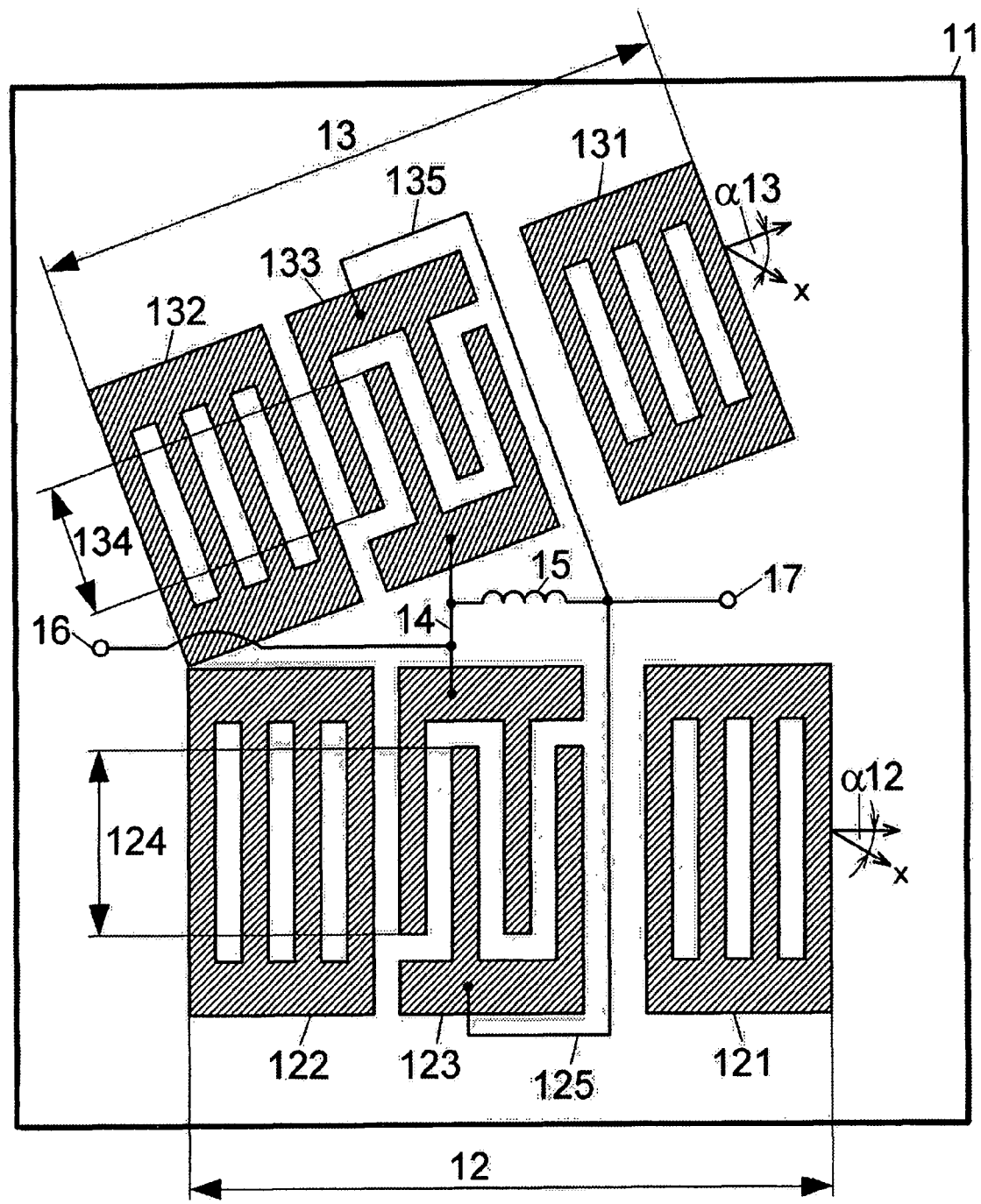
FIG. 2 shows, as a second exemplary embodiment, a parallel circuit of two one-port surface wave resonators and one inductance.

In this exemplary embodiment, according to FIG. 2, two one-port surface wave resonators 12; 13 are disposed on a substrate 11 that is an ST section of quartz; the resonators are composed of the reflectors 121; 122 and the interdigital converter 123, and of the reflectors 131; 132 and the interdigital converter 133, respectively. The apertures 124; 134 of the converters 123; 133 are different from one another. The direction perpendicular to the teeth of the converter 123 and the strips of the reflectors 121; 122 is inclined at the angle α12 relative to the crystallographic X-axis, whereby α12 lies between 0° and 45°. The direction perpendicular to the teeth of the converter 133 and the strips of the reflectors 131; 132 is inclined at the angle α13 relative to the crystallographic X-axis, whereby α13 is greater than 45°. The directions designated with the angles α12 and α13 have a temperature coefficient of the synchronous frequency of the $n^{th}$ equal to the $1^{st}$ order, which is greater than and less than zero, respectively, while the temperature coefficients of the synchronous frequency of the $(n+1)^{th}$ equal to the $2^{nd}$ order of both directions have the same sign. The converters 123; 133 are switched in parallel with one another and with an inductance 15 by way of the connections 125, 135, and 14. The resonator formed by the one-port surface wave resonators 12; 13 and the inductance 15 is a two-pole whose connectors 16; 17 represent its two poles. It is possible to compensate both the temperature coefficient of the oscillator frequency of the first and of the second order by setting the ratio of the apertures 124 and 134 and the tooth number of the converters 123; 133 as well as of the inductance 15.

EXAMPLE 3

Figure 3:
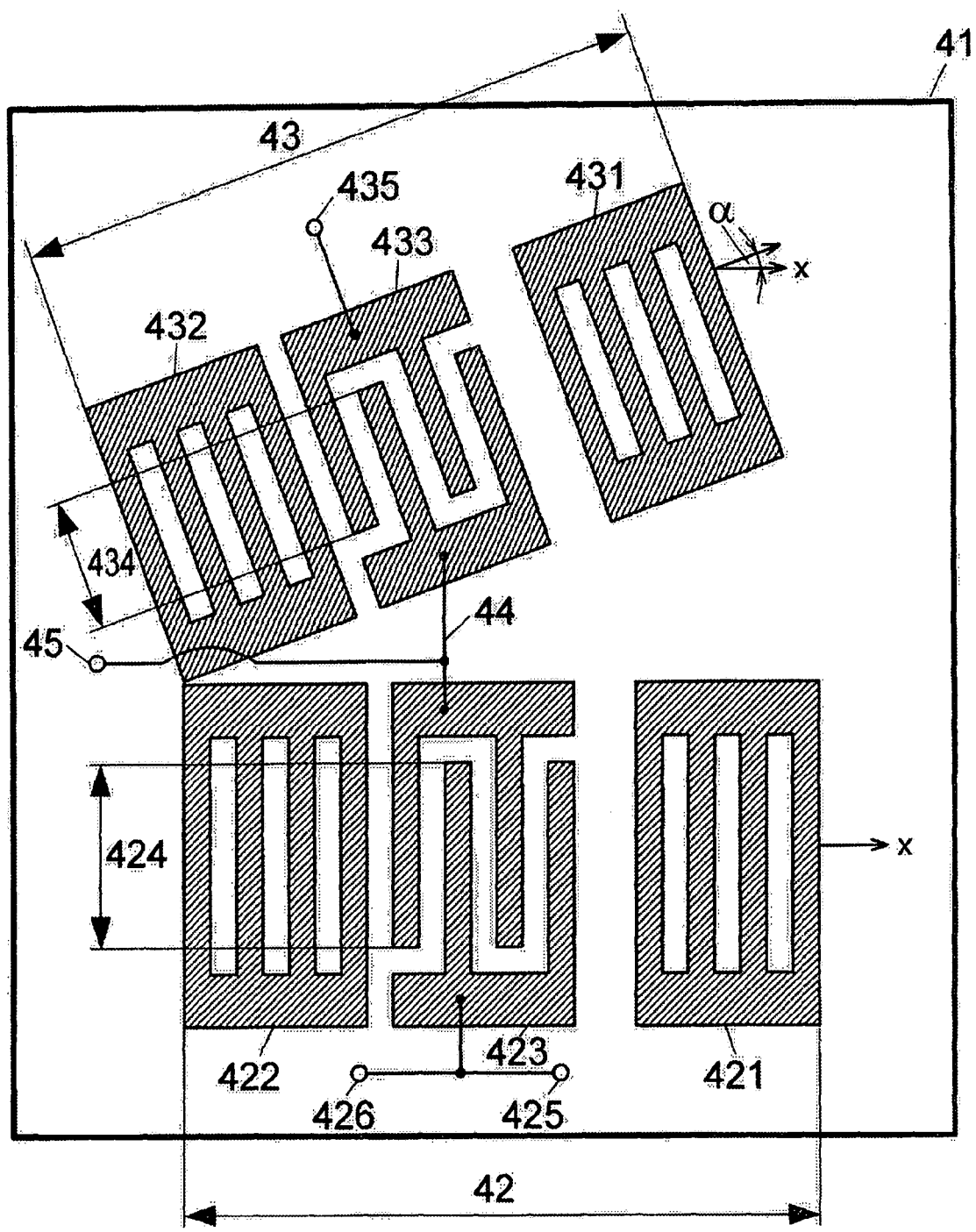
FIG. 3 shows, as a third exemplary embodiment, a circuit of the conductor type, of two one-port surface wave resonators.

In this connection, according to FIG. 3, two one-port surface wave resonators 42; 43 are disposed on a substrate 41 that is an ST section of quartz; the resonators are composed of the reflectors 421; 422 and the interdigital converter 423, and of the reflectors 431; 432 and the interdigital converter 433, respectively. The apertures 424; 434 of the converters 423; 433 are different from one another. The direction perpendicular to the teeth of the converter 423 and the strips of the reflectors 421; 422 is parallel to the crystallographic X-axis, whereby the thickness of the electrode layer is selected in such a manner that the temperature coefficient of the synchronous frequency of the first order disappears at room temperature. The temperature coefficient of the synchronous frequency of the $n^{th}$ equal to the $1^{st}$ order of the two resonators 42; 43 is equal to zero, while the signs of the temperature coefficients of the synchronous frequency of the $(n+1)^{th}$ equal to the $2^{nd}$ order agree. The direction perpendicular to the teeth of the converter 433 and the strips of the reflectors 431; 432 is inclined at the angle α relative to the crystallographic X-axis, whereby α is that angle at which the temperature coefficient of the synchronous frequency of the first order disappears at room temperature. The converters 423 and 433 are connected with one another by way of the connection 44. The resonator formed by the one-port surface wave resonators 42 and 43 is a four-pole whose connectors 45; 426; 435 and 425 represent its four poles. The connector pairs 45; 426 and 435; 425 form the input and output of the four-pole, respectively, or vice versa. It is possible to make the variation of the oscillator frequency smaller in a temperature range that includes room temperature, using this resonator as a frequency-determining element, by setting the ratio of the apertures 424 and 434, the tooth number and the tooth period of the converters 423 and 433, than is the case as the result of the smaller temperature coefficient of the synchronous frequency of the second order of the two one-port surface wave resonators 42; 43.

The invention claimed is:

1. Oscillator, consisting of an oscillator circuit that contains a circuit consisting of two one-port surface wave resonators (2; 3; 12; 13; 42; 43) as a frequency-determining element and an active electronic component, whereby each one-port surface wave resonator (2; 3; 12; 13; 42; 43) contains an interdigital converter (23; 33; 123; 133; 423; 433) for acoustical surface waves, and whereby the one-port surface wave resonators (2; 3; 12; 13; 42; 43) differ from one another by the temperature dependence of the synchronous frequency, wherein the one-port surface wave resonators (2; 3; 12; 13; 42; 43) use different propagation directions, and wherein a) the temperature coefficients of the first order of the synchronous frequency of the two one-port surface wave resonators (2; 3; 12; 13; 42; 43), with reference to a predetermined temperature, have different signs or are equal to zero, and wherein the temperature coefficients of the second order of the synchronous frequency of the two one-port surface wave resonators (2; 3; 12; 13; 42; 43), with reference to a predetermined temperature, have the same signs, whereby aa) if the temperature coefficients of the first order of the synchronous frequency of the two oneport surface wave resonators (2; 3; 12; 13; 42; 43) have different signs, the circuit consisting of the two one-port surface wave resonators (2; 3; 12; 13; 42; 43) is a two-pole, in which an inductance is switched in parallel at least to one of the one-port surface wave resonators (2; 3; 12; 13; 42; 43), and whereby ab) if the temperature coefficients of the first order of the synchronous frequency of the two one-port surface wave resonators (2; 3; 12; 13; 42; 43) are equal to zero, the circuit consisting of the two one-port surface wave resonators (2; 3; 12; 13; 42; 43) is a four-pole, and wherein b) in the case of the converters (23; 33; 123; 133; 423; 433), the ratio of their apertures (24; 34; 124; 134; 424; 434) relative to one another and the ratio of their tooth numbers (23; 33; 123; 133; 423; 433) relative to one another are selected in such a manner that the temperature influence on the oscillator frequency is a minimum in the usage temperature range of the oscillator, or has a desired value deviating from the minimum.

2. Oscillator according to claim 1, wherein the circuit consisting of two one-port surface wave resonators (2; 3) is a two-pole, in which two circuits, in each of which a one-port surface wave resonator (2; 3) and an inductance (26; 36) are switched in parallel, in each instance, are switched in series.

3. Oscillator according to claim 1, wherein the four-pole is a four-pole of the conductor type, whereby the two one-port surface wave resonators (42; 43) are switched in series by way of an electrical connection (44), and the first pole (45) of the input of the four-pole is formed by a branching of the electrical connection (44), and the first pole (435) of the output of the four-pole is formed by that connector of the first one-port surface wave resonator (43) that is not connected with the second one-port surface wave resonator (42), in each instance, and the second pole of the input and the output (426; 425) of the four-pole is formed by that connector of the second one-port surface wave resonator (42) that is not connected with the first one-port surface wave resonator (43), in each instance.

4. Oscillator according to claim 1, wherein the two-pole is switched into an oscillator circuit that contains a component having a differential negative resistance as the active electronic component.

5. Oscillator according to claim 1, wherein the oscillator circuit contains an amplifier as the active electronic component, whereby the two-pole is inserted into the feedback of the amplifier, switched in series with or parallel to the input and output of the amplifier.

6. Oscillator according to claim 1, wherein the oscillator circuit contains an amplifier as the active electronic component, and the four-pole is inserted into the feedback of an amplifier and the input and output, respectively, of the four-pole is connected with the output or input, respectively, of the amplifier.

7. Oscillator according to claim 1, wherein the two one-port surface wave resonators (2; 3; 12; 13; 42; 43) are built up with substrates of the same crystal type.

8. Oscillator according to claim 1, wherein the substrates of the one-port surface wave resonators (2; 3; 12; 13; 42; 43) belong to different crystal types.

9. Oscillator according to claim 1, wherein the substrates of the one-port surface wave resonators (2; 3; 12; 13; 42; 43) are built up with different crystal sections.

10. Oscillator according to claim 1, wherein the one-port surface wave resonators (2; 3; 12; 13; 42; 43) use different propagation directions for acoustical surface waves on one and the same crystal section.

11. Oscillator according to claim 1, wherein the one-port surface wave resonators (2; 3; 12; 13; 42; 43) are disposed on separate substrates.

12. Oscillator according to claim 1, wherein the electrode structures of the two one-port surface wave resonators (2; 3; 12; 13; 42; 43) are disposed on a common substrate.

13. Oscillator according to claim 1, wherein the temperature coefficient of the synchronous frequency of the same order dominates in the two oneport surface wave resonators (2; 3; 12; 13; 42; 43).

14. Oscillator according to claim 1, wherein the temperature coefficient of the synchronous frequency of the first order dominates in the two one-port surface wave resonators (2; 3; 12; 13; 42; 43).

15. Oscillator according to claim 1, wherein the temperature coefficient of the synchronous frequency of the second order dominates in the two one-port surface wave resonators (2; 3; 12; 13; 42; 43).

16. Oscillator according to claim 1, wherein the temperature coefficient of the first order of the synchronous frequency of each of the two one-port surface wave resonators (2; 3) is unequal to zero and differs in sign from this temperature coefficient of the other one-port surface wave resonator, in each instance.

17. Oscillator according to claim 1, wherein the temperature coefficients of the second order of the synchronous frequency of the two one-port surface wave resonators (2; 3; 12; 13; 42; 43) are unequal to zero and have the same sign, whereby the temperature coefficients of the first order, with reference to a predetermined temperature, are equal to zero.

18. Oscillator according to claim 9, wherein the crystal section is an ST section of quartz and wherein the direction perpendicular to the teeth of the converters and to the reflector strips is inclined at an angle between 0° and 45° for the one oneport surface wave resonator (2; 12), and at an angle >45° to the crystallographic X-axis of quartz for the other one-port surface wave resonator (3; 13).

19. Oscillator according to claim 1, wherein the tooth period and aperture (24; 34; 124; 134; 424; 434) of the converters (23; 33; 123; 133; 423; 433), as well as the thickness of the electrode layer of the one-port surface wave resonators (2; 3; 12; 13; 42; 43), is selected in such a manner that their resonances have a predetermined frequency interval at a predetermined temperature, which serves to set an optimal temperature tolerance of the oscillator frequency.

* * * * *

UNITED STATES PATENT AND TRADEMARK OFFICE
CERTIFICATE OF CORRECTION

PATENT NO. : 7,511,587 B2 Page 1 of 1
APPLICATION NO. : 11/793002
DATED : March 31, 2009
INVENTOR(S) : Martin It is certified that error appears in the above-identified patent and that said Letters Patent is hereby corrected as shown below:

Column 8, line 21, (Line 5 of Claim 18) please change "oneport" to correctly read: --one-port--.

Signed and Sealed this

Sixteenth Day of June, 2009

JOHN DOLL
*Acting Director of the United States Patent and Trademark Office*